(12) United States Patent
Neisser et al.

(10) Patent No.: US 7,070,914 B2
(45) Date of Patent: Jul. 4, 2006

(54) PROCESS FOR PRODUCING AN IMAGE USING A FIRST MINIMUM BOTTOM ANTIREFLECTIVE COATING COMPOSITION

(75) Inventors: Mark O. Neisser, Whitehouse Station, NJ (US); Joseph E. Oberlander, Phillipsburg, NJ (US); Medhat A. Toukhy, Flemington, NJ (US); Raj Sakamuri, Sharon, MA (US); Shuji Ding-Lee, Branchburg, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/042,878

(22) Filed: Jan. 9, 2002

(65) Prior Publication Data

US 2003/0129547 A1    Jul. 10, 2003

(51) Int. Cl.
*G03F 7/00*    (2006.01)
(52) U.S. Cl. .................... 430/322; 430/290; 430/311; 430/313; 430/950
(58) Field of Classification Search ............... 430/290, 430/311, 313, 322, 950
See application file for complete search history.

(56) References Cited

U.S. PATENT DOCUMENTS

| 4,491,628 A | 1/1985 | Ito et al. ..................... 430/176 |
| 4,521,274 A | 6/1985 | Reichmanis et al. .......... 216/47 |
| 4,557,797 A | 12/1985 | Fuller et al. ................. 438/514 |
| 4,557,996 A | 12/1985 | Aoyama et al. ............ 430/324 |
| 4,863,827 A | 9/1989 | Jain et al. .................... 430/145 |
| 4,910,122 A | 3/1990 | Arnold et al. ............... 430/313 |
| 5,069,997 A | 12/1991 | Schwalm et al. ......... 430/270.1 |
| 5,286,867 A | 2/1994 | Lohaus et al. .............. 546/249 |
| 5,338,641 A | 8/1994 | Pawlowski et al. ......... 430/165 |
| 5,340,682 A | 8/1994 | Pawlowski et al. ......... 430/165 |

(Continued)

FOREIGN PATENT DOCUMENTS

DE    39 30 086    3/1991

(Continued)

OTHER PUBLICATIONS

James Fahey et al, "Design of a Bottom Anti-Reflective Layer for OPtical Lithography", SPIE, vol. 2195, pp. 422-446.

(Continued)

*Primary Examiner*—Nicole Barreca
(74) *Attorney, Agent, or Firm*—Sangya Jain

(57) ABSTRACT

Disclosed is a process for forming an image on a substrate, comprising the steps of: (a) coating on the substrate a first layer of a radiation sensitive, antireflective composition; (b) coating a second layer of a photoresist composition onto the first layer of the antireflective composition; (c) selectively exposing the coated substrate from step (b) to actinic radiation; and (d) developing the exposed coated substrate from step (c) to form an image; wherein both the photoresist composition and the antireflective composition are exposed in step (c); both are developed in step (d) using a single developer; wherein the antireflective composition of step (a) is a first minimum bottom antireflective coating (B.A.R.C.) composition, having a solids content of up to about 8% solids, and a maximum coating thickness of the coated substrate of $$\frac{\lambda}{2n}$$

wherein λ is the wavelength of the actinic radiation of step (c) and n is the refractive index of the B.A.R.C. composition.

25 Claims, 5 Drawing Sheets

Aerial Image in BARC

Latent Image before PEB

Latent Image after PEB

U.S. PATENT DOCUMENTS

| | | | |
|---|---|---|---|
| 5,350,660 A | 9/1994 | Urano et al. | 430/170 |
| 5,354,643 A | 10/1994 | Cabrera et al. | 430/270.1 |
| 5,389,491 A | 2/1995 | Tani et al. | 430/170 |
| 5,419,991 A | 5/1995 | Segawa | 430/20 |
| 5,482,817 A * | 1/1996 | Dichiara et al. | 430/271.1 |
| 5,581,730 A | 12/1996 | Silla | 711/144 |
| 5,585,219 A | 12/1996 | Kaimoto et al. | 430/270.1 |
| 5,635,333 A | 6/1997 | Peterson | 430/311 |
| 5,652,297 A | 7/1997 | McCulloch et al. | 524/555 |
| 5,688,365 A * | 11/1997 | Ogishi | 156/661.11 |
| 5,691,101 A | 11/1997 | Ushirogouchi et al. | 430/176 |
| 5,693,691 A | 12/1997 | Flaim et al. | 523/436 |
| 5,695,910 A | 12/1997 | Urano et al. | 430/270.1 |
| 5,716,756 A | 2/1998 | Pawlowski et al. | 430/270.1 |
| 5,731,386 A | 3/1998 | Thackeray et al. | 525/328.2 |
| 5,763,135 A | 6/1998 | Ding et al. | 430/191 |
| 5,763,954 A | 6/1998 | Hyakutake | 257/774 |
| 5,795,701 A | 8/1998 | Conley et al. | 430/325 |
| 5,851,738 A | 12/1998 | Thackeray et al. | 430/327 |
| 5,871,730 A | 2/1999 | Brzezinski et al. | 424/94.61 |
| 5,880,169 A | 3/1999 | Osawa et al. | 522/25 |
| 5,882,967 A * | 3/1999 | Brown et al. | 438/237 |
| 5,882,996 A | 3/1999 | Dai | 438/597 |
| 5,886,102 A | 3/1999 | Sinta et al. | 525/154 |
| 5,919,599 A * | 7/1999 | Meador et al. | 430/271.1 |
| 5,928,837 A | 7/1999 | Sato et al. | 430/270.1 |
| 5,935,760 A | 8/1999 | Shao et al. | 430/271.1 |
| 5,939,236 A | 8/1999 | Pavelcheck et al. | 430/273.1 |
| 5,981,145 A | 11/1999 | Ding et al. | 430/271.1 |
| 5,994,006 A | 11/1999 | Nishi | 430/22 |
| 6,042,990 A | 3/2000 | Shao et al. | 430/271.1 |
| 6,054,254 A | 4/2000 | Sato et al. | 430/322 |
| 6,080,530 A | 6/2000 | Shao et al. | 430/325 |
| 6,087,250 A * | 7/2000 | Hyakutake | 438/598 |
| 6,090,694 A * | 7/2000 | Hause et al. | 438/597 |
| 6,110,641 A | 8/2000 | Trefonas, III et al. | 430/270.1 |
| 6,110,653 A | 8/2000 | Holmes et al. | 430/325 |
| 6,114,085 A | 9/2000 | Padmanaban et al. | 430/270.1 |
| 6,187,506 B1 | 2/2001 | Ding et al. | 430/271.1 |
| 6,242,161 B1 | 6/2001 | Kawaguchi et al. | 430/313 |
| 6,251,562 B1 | 6/2001 | Breyta et al. | 430/287.1 |
| 6,261,743 B1 | 7/2001 | Pavelcheck et al. | 430/325 |
| 6,268,907 B1 * | 7/2001 | Samuels et al. | 355/71 |
| 6,312,870 B1 * | 11/2001 | Malik et al. | 430/270.1 |
| 6,316,165 B1 | 11/2001 | Pavelchek et al. | 430/311 |
| 6,319,649 B1 | 11/2001 | Kato et al. | 430/176 |
| 6,319,651 B1 | 11/2001 | Holmes et al. | |
| 6,322,948 B1 | 11/2001 | Jung et al. | 430/270.1 |
| 6,323,310 B1 * | 11/2001 | Puligadda et al. | 528/423 |
| 6,329,117 B1 | 12/2001 | Padmanaban et al. | 430/270.1 |
| 6,338,936 B1 | 1/2002 | Ichikawa et al. | 430/285.1 |
| 6,365,322 B1 * | 4/2002 | Panmanaban et al. | 430/270.1 |
| 6,399,481 B1 * | 6/2002 | Yamada | 438/636 |
| 6,447,980 B1 * | 9/2002 | Rahman et al. | 430/270.1 |
| 6,451,498 B1 | 9/2002 | Pirri et al. | 430/270.1 |
| 6,537,727 B1 * | 3/2003 | Yoon et al. | 430/270.1 |
| 2003/0104322 A1 | 6/2003 | Yamashita et al. | 430/331 |
| 2003/0129531 A1 | 7/2003 | Oberlander et al. | 430/271.1 |
| 2003/0215736 A1 | 11/2003 | Oberlander et al. | 430/270.1 |
| 2004/0013971 A1 | 1/2004 | Berger et al. | 430/270.1 |

FOREIGN PATENT DOCUMENTS

| | | |
|---|---|---|
| DE | 39 30 087 | 3/1991 |
| DE | 41 12 967 | 10/1992 |
| EP | 0 542 008 A1 | 5/1993 |
| EP | 0 583 205 | 2/1994 |
| EP | 0 726 500 A | 8/1996 |
| EP | 0 813 114 A2 | 5/1997 |
| EP | 0 794 458 | 9/1997 |
| EP | 0 905 565 | 3/1999 |
| EP | 942331 * | 9/1999 |
| GB | 2 135 793 A | 9/1984 |
| GB | 2 320 718 | 7/1998 |
| GB | 2 354 763 | 4/2001 |
| GB | 2 357 509 | 6/2001 |
| JP | 5-107770 | 4/1993 |
| JP | 7-159997 | 6/1995 |
| JP | 7-181687 | 7/1995 |
| JP | 8-286384 | 11/1996 |
| JP | 9-205057 | 8/1997 |
| JP | 9-260255 * | 10/1997 |
| JP | 10-301268 | 11/1998 |
| JP | 2000-171604 | 6/2000 |
| WO | WO 97/33198 | 9/1997 |

OTHER PUBLICATIONS

C. Nolscher et al, "High contrast single layer resists and antireflection layers—an alternative to multilayer resist techniques", SPIE, vol. 1086, 1989, pp. 242-250.

Sturtevant et al., *Removable Organic Antireflection Coating*, SPIE, vol. 2724, 738-746 (1996).

Yoshino et al., *Compatibility of Chemically Amplified Photoresists with Bottom Anti-reflective Coatings*, SPIE, vol. 3333, 655-665 (1998).

Bather et al., "Titanium Nitride Oxide (TiNxOly) as a Barrier Between Chromium-Silicon-Oxygen (Cr-Si-(O)) and Aluminium Thin Films", Thin Solid Films vol. 200, pp. 93-116 (1991).

Cho et al., "Negative tone 193 nm resists", SPIE vol. 3999, pp. 62-73 (2000).

Choi et al., "Design and Synthesis of New Photoresist Materials for ArF Lithography", SPIE vol. 3999, pp. 54-61 (2000).

Choi et al., "Improved Lithographic Performance of 193nm-Photoresists Based on Cycloolefin / Maleic Anhydride Copolymer by Employing Mixed PAG's", SPIE vol. 4345, pp. 94-105 (2001).

Czech et al., "Reduction of Linewidth Variation for the Gate Conductor Level by Lithography Based on a New Antireflective Layer", Microelectronic Engineering vol. 21, pp. 51-56 (1993).

Fu et al., "Negative-tone Cycloolefin Photoresist for 193 nm Lithography", SPIE vol. 4345, pp. 751-760 (2001).

Houlihan et al, "Chemically Amplified Resists: The Chemistry and Lithographic Characteristics of Nitrobenzyl Benzenesulfonate Derivatires", Journal of Photopolymer Science and Technology vol. 3, No. 3, pp. 259-273 (1990).

Ito, "Chemically Amplified Resists: Past, Present, and Future", SPIE vol. 3678, pp. 2-12 ( Mar. 1999).

Iwasa et al., "Novel negative photoresist based on polar alicyclic polymers for ArF excimer laser lithography", SPIE vol. 3333, pp. 417-424 ( ).

Naito et al., "Negative-type chemically amplified resists for ArF excimer laser lithography", SPIE vol. 3333, pp. 503-511 ( ).

Nöischer et al., "High contract single layer resists and antireflection layers - an alternative to multilayer resist techniques", SPIE vol. 1086, pp. 242-250 (1989).

Richter et al., "Negative Tone Resists for Phase-Shifting Mask Technology: A Progress Report", SPIE vol. 3999, pp. 91-101 (2000).

Rushkin et al., "New Polymers for 193 nm Single Layer Resists Based on Substituted Cycloolefins/Maleic Anhydride Resins", SPIE vol. 3678, pp. 44-50 (Mar. 1999).

Schlegel et al., "Studies on the Acid Formation and Deprotection Reaction by Sovel Sulfonates in a Chemical Positive Photoresist", Journal of Photopolymer Science and Technology vol. 3, No. 3, pp. 281-287 (1990).

Shida et al., "193-nm Single Layer Resists Based on Advanced Materials", SPIE vol. 4345, pp. 87-93 (2001).

Shirai et al., "Photochemistry of Imino Sulfonate Compounds and Their Applications to Chemically Amplified Resists", Journal of Photopolymer Science and Technology, vol. 3, No. 3, pp. 301-304 (1990).

Yamaoka et al., "Photochemical Dissociation of p-Nitrobenzyl Aromatic Sulfonate and Its Application to Chemical Amplification Resists", Journal of Photopolymer Science and Technology vol. 3, No. 3, pp. 275-280 (1990).

Yokoyama et al, "ArF Negative Resist System Using Androsterone Structure with 6-Hydroxy Acid for 100-nm Phase-Shifting Lithography", SPIE vol. 4345, pp. 58-66 (2001).

Yokoyama et al., "Effect of Comonomer Structure on Dissolution Characteristics ArF Negative Resist System Using Androsterone Derivative with ?-Hydroxy Acid", Journal of photopolymer Science and Technology vol. 14, No. 3, pp. 393-400 (2001).

Copy of Official Action (and English translation thereof) for JP Application No. Hei-10-186575.

English Language abstract of 2000-171604.

* cited by examiner

Aerial Image in BARC

Latent Image before PEB

Latent Image after PEB

Aerial Image in BARC

Latent Image before PEB

Latent Image after PEB

PROCESS FOR PRODUCING AN IMAGE USING A FIRST MINIMUM BOTTOM ANTIREFLECTIVE COATING COMPOSITION

FIELD OF THE INVENTION

This invention relates to the field of antireflective coatings and to a process for forming an image on a substrate using an antireflective coating composition.

BACKGROUND OF THE INVENTION

In the production of semiconductor devices, an integrated circuit substrate is coated with a film of photo patterning resist, exposed to actinic radiation, and developed to define a resist image over the integrated circuit substrate. The resist image can, for example, include both lines and spaces, wherein portions of the photo patterning resist that are removed form the spaces and the portions that remain form the lines. The resist image is transferred to the integrated circuit substrate by modifying the exposed portion of the substrate. Such modification may be performed by removal of a portion of the substrate by etching processes, by implantation of atomic species into the substrate, or by other methods known to those skilled in the art. During such processes, the photo patterned resist lines act as a mask to prevent modification of the portions of the substrate underlying the resist lines. Resolution of the image transferred to the substrate is dependent on the resolution of the resist image.

During exposure of a photo patterning resist on an integrated circuit substrate, some reflection of the actinic radiation off the integrated circuit substrate will typically occur. The reflection causes film interference effects that change the effective exposure intensity within a chip, across the wafer, and from wafer to wafer. Given the variation in effective exposure intensity, an unacceptable amount of line width variation typically occurs. This is especially true in modern manufacturing where laser exposure tools are used as the source of the actinic radiation and reflection is particularly prevalent.

To prevent reflection of actinic radiation into a photo patterning resist, one or more layers of an antireflective coating (A.R.C.) may be provided between a substrate and a photo patterning resist film. A.R.C.s often include a radiation adsorbing dye dispersed in a polymer binder, however, some polymers exist that contain an appropriate chromophore that sufficiently adsorbs the actinic radiation (i.e., the chromophore acts as the dye) such that an additional adsorbing dye is not required. The A.R.C. may be adapted to attenuate a particular wavelength of radiation used to expose the photo patterning resist by a selection of suitable adsorbing dyes or a polymer having suitable chromophores.

The use of an A.R.C. however is not without problems. Once the photo patterning resist film is developed, exposing the underlying A.R.C., the A.R.C. must be removed to expose the underlying integrated circuit substrate for subsequent modification as mentioned above. Commonly, the A.R.C. is removed using a reactive ion etch process, however, other types of dry etching or wet etching as known to those skilled in the art may be used.

Bottom antireflective coatings (B.A.R.C.s) generally come in two classes, the developer soluble class in which the B.A.R.C. is dissolved in the developer at the time of the resist development, or developer-insoluble B.A.R.C.s in which the image is transferred through the B.A.R.C. in a dry etch step. The developer soluble B.A.R.C.s are typically materials that are slightly soluble in the developer and dissolve isotropically as soon as the resist above them dissolves during the development process. The logical consequence of this is that there is significant undercutting of the resist as the B.A.R.C. dissolves away underneath it, and there is a sloped B.A.R.C. edge profile. The undercutting and sloped profile promote lift-off of small resist features and limits the resolution of such B.A.R.C.s. Thus currently available developer soluble B.A.R.C.s do not have the needed high resolution (e.g., in the sub-quarter micron range) and do not meet the needs of processes such as shallow implants, described below. Therefore, all high resolution B.A.R.C.s that are currently used are developer insoluble. Thus, generally inorganic B.A.R.C.s are of the developer insoluble class, as are most of the high resolution organic B.A.R.C.s. The reason for this has been set forth above—i.e., due to the problem of avoiding footing or undercuts with what is essentially an isotropic wet etch process of the B.A.R.C. Even if the B.A.R.C. dissolution rate is exactly matched to that of the resist in the correct exposure state for imagewise printing, an undercut-free and foot free, vertical profile is achieved at best only for an infinitesimally short moment. While this can be accepted for larger features, this behavior leads to a low process latitude for high resolution imaging (see FIG. 1).

For a number of applications, e.g., for shallow implants, it is desirable to avoid damage to the substrate by plasma processing. At the same time, control of reflections from the surface and control of the swing curve may make the use of a B.A.R.C. desirable. These technical requirements together can be met by the use of a developer-soluble B.A.R.C., but not if high resolution, e.g., in the sub-quarter micron region, is desired. Currently, there appear to be no B.A.R.C.s that both avoid dry etching and provide sufficient resolution for the above mentioned applications.

The present invention resolves this impasse by providing a first minimum B.A.R.C. that is developed at the time of resist development. It resolves the issue of poor sidewall control by using a photosensitive B.A.R.C., or, expressed in an alternative way, a highly dyed photoresist on which a second photoresist imaging layer can be applied without or with only minimal intermixing. The photosensitive B.A.R.C. of the invention is exposed during the photoresist exposure step; there is no second exposure step following the photoresist development. The exposure of the B.A.R.C. to light generates a solubility gradient in the B.A.R.C. that makes it possible to achieve an anisotropic component in the B.A.R.C. dissolution, as opposed to the isotropic development of conventional developer-soluble B.A.R.C.s.

U.S. Pat. No. 6,110,653, issued Aug. 29, 2000, to inventors Holmes et al., discloses a method comprising the steps of applying a radiation adsorbing layer on a substrate and forming an acid sensitive, water insoluble A.R.C. therefrom, applying a photo patterning resist (PPR) layer on the A.R.C., exposing part of the PPR layer to actinic radiation, developing the PPR layer to form a resist image, rendering the A.R.C. water soluble, and developing the A.R.C. to uncover selected portions of the substrate.

1.7043, 0.0071; B.A.R.C.: 1.68, 0.60 (left) and 0.30 (right), substrate (Si): 0.95, 2.64. Exposure wavelength: 193 nm.

Figure 3:
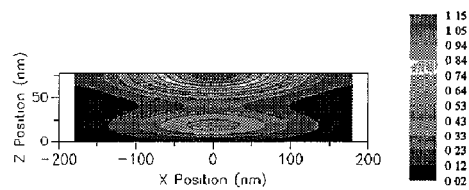
Figure 3:
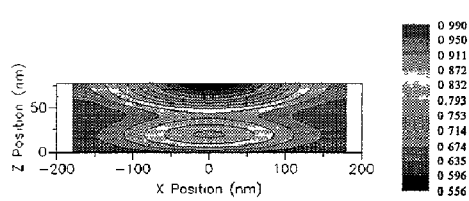
Figure 3:
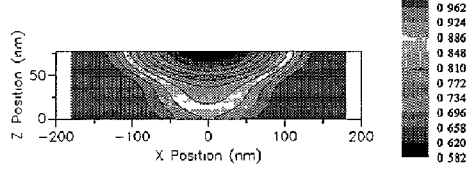

FIG. 3 shows second minimum B.A.R.C. simulation results, indicating presence of a standing wave node in the B.A.R.C. at approximately $\lambda/(2n)$ film thickness.

Figure 4:
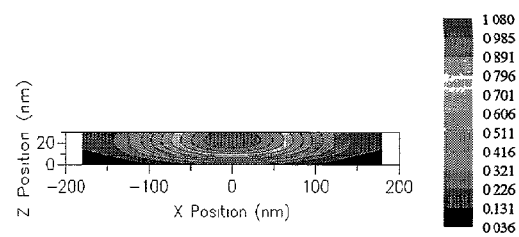
Figure 4:
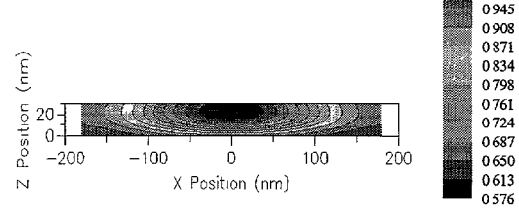
Figure 4:
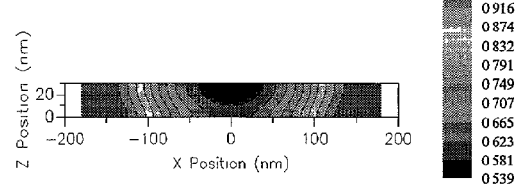

FIG. 4 shows first minimum B.A.R.C. simulation results, indicating absence of a standing wave node in the latent images.

Figure 5:
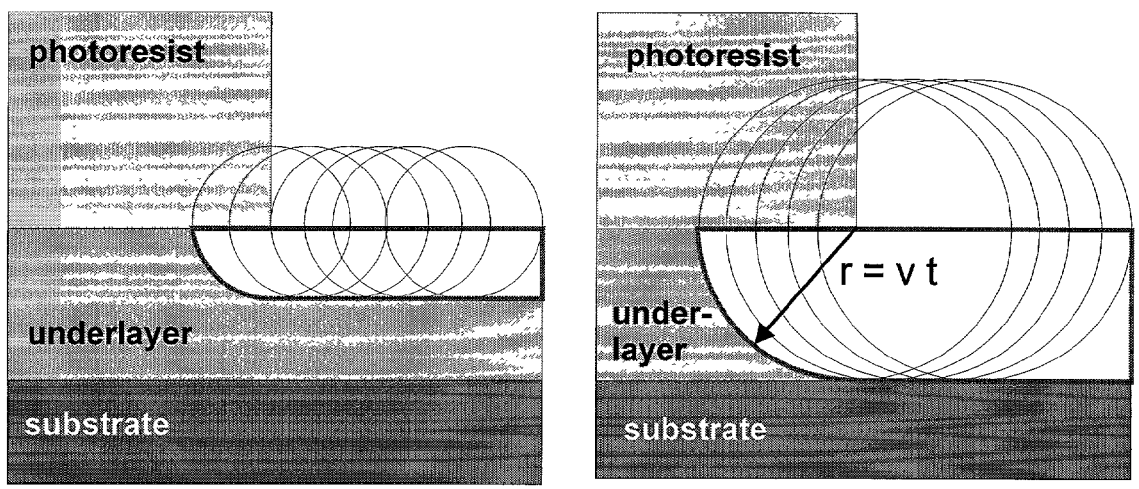

FIG. 5 illustrates the geometrical locus of an etch front given by superposition of spheres. The figure on the left shows wet etching of layer of isotropic material protected by photoresist. The figure on the right shows etching to remove the entire film depth.

SUMMARY OF THE INVENTION

The present invention provides a process for forming an image on a substrate, comprising the steps of:

(a) coating on a substrate a first layer of a radiation sensitive antireflective composition;

(b) coating a second layer of a photoresist composition onto the first layer of the antireflective composition;

(c) selectively exposing the coated substrate from step (b) to actinic radiation; and (d) developing the exposed coated substrate from step (c); wherein both the photoresist composition and the antireflective composition are exposed in step (c); both are developed in step (d) using a single developer; wherein the antireflective composition of step (a) is a first minimum bottom antireflective coating (B.A.R.C.) composition, having a solids content of up to about 8% solids, and a maximum coating thickness of the coated substrate of $$\frac{\lambda}{2n}$$

wherein $\lambda$ is the wavelength of the actinic radiation of step (c) and n is the refractive index of the B.A.R.C. composition.

DETAILED DESCRIPTION OF THE INVENTION

The present invention provides a process for forming an image on a substrate, comprising the steps of:

(a) coating on a substrate a first layer of a radiation sensitive antireflective composition;

(b) coating a second layer of a photoresist composition onto the first layer of the antireflective composition;

(c) selectively exposing the coated substrate from step (b) to actinic radiation; and (d) developing the exposed coated substrate from step (c); wherein both the photoresist composition and the antireflective composition are exposed in step (c); both are developed in step (d) using a single developer; wherein the antireflective composition of step (a) is a first minimum bottom antireflective coating (B.A.R.C.) composition, having a solids content of up to about 8% solids and a maximum coating thickness of the coated substrate of $$\frac{\lambda}{2n}$$

wherein $\lambda$ is the wavelength of the actinic radiation of step (c) and n is the refractive index of the B.A.R.C. composition.

As used herein, "first minimum B.A.R.C. composition" refers to a B.A.R.C. composition, where the B.A.R.C. coating thickness is close to the film thickness value that corresponds to the first minimum value in a standard plot of normalized (i.e., relative) reflectance or normalized square root of reflectance versus film thickness. (See, for example, FIG. 2). Such curves are well known to those of ordinary skill in the art, and can be plotted using equations well known to those of ordinary skill in the art. Similarly, "second minimum B.A.R.C. composition" refers to a composition wherein the coating thickness is close to the film thickness corresponds to the second minimum value in the standard plot described above.

Through Brunner's equation (T. Brunner, Proc. SPIE 1466, 297 (1991)), it is possible to ratio the swing amplitudes for a given thickness $d_b$ of the bottom coat to that of the substrate without bottom coat ($d_b=0$). In this way, the swing amplitude reduction $S_{rel}$ relative to the substrate is obtained as the square root of the ratio of the reflectivities into the resist. Similarly, one can define $S_{rel}$ for multiple thin film stacks versus the substrate.

$$S_{B.A.R.C.}(d_b) = 4\sqrt{R_t R_{B.A.R.C.}(d_b)}\, e^{-\alpha \cdot d_r}$$
$$S_{Substrate} = S_{B.A.R.C.}(0)$$
$$= 4\sqrt{R_t R_{B.A.R.C.}(0)}\, e^{-\alpha \cdot d_r}$$
$$S_{rel}(d_b) = \frac{S_{B.A.R.C.}(d_b)}{S_{Substrate}}$$
$$= \sqrt{\frac{R_{B.A.R.C.}(d_b)}{R_{B.A.R.C.}(0)}}$$

In the above equations, $S_{B.A.R.C.}(d_b)$ is the swing amplitude of the B.A.R.C. layer for a given thickness $d_b$; $R_t$ is the reflectance at the top of the resist layer, e.g., to air or to a top antireflective layer, $R_{B.A.R.C}(d_b)$. is the reflectivity of the B.A.R.C. layer at thickness $d_b$; $R_{B.A.R.C}(0)$ is the reflectivity of the substrate ($d_b=0$); $\alpha$ is the resist absorbance, and $d_r$ is the resist thickness.

The maximum thickness of the first minimum B.A.R.C. layer is $$\frac{\lambda}{2n}$$

wherein $\lambda$ the wavelength of the actinic radiation used to expose the coated substrate, and n is the refractive index of the B.A.R.C. composition. In one embodiment, the first minimum B.A.R.C. composition has a maximum coating thickness of 50 nanometers (nm) for 157 and 193 nm exposures, and in one embodiment, 70 nm for 248 nm exposure, and in one embodiment 120 nm for 365 nm exposure.

In one embodiment of the present invention, the radiation sensitive antireflective composition and the photoresist composition comprise a positive-working composition wherein the antireflective and the photoresist compositions are initially insoluble in the developer but are rendered developer-soluble upon exposure to actinic radiation.

In one embodiment, the radiation sensitive antireflective composition and the photoresist composition comprise a negative-working composition wherein the antireflective and the photoresist compositions are initially soluble in the developer but are rendered developer-insoluble upon exposure to actinic radiation.

In one embodiment, the B.A.R.C. composition is substantially free of cross-linking and is insoluble in the photoresist solvent (i.e., the solvent used in the photoresist composition that is used in step (b) of the present invention. The coating of the second layer of the photoresist composition in step (b) is typically conducted using a solution of photoresist composition in a suitable photoresist solvent). Suitable photoresist solvents include propylene glycol methyl ether acetate (PGMEA), 3-methoxy-3-methyl butanol, 2-heptanone (methyl amyl ketone), propylene glycol methyl ether (PGME), ethylene glycol monomethyl ether, ethylene glycol monoethyl ether, diethylene glycol monoethyl ether, ethylene glycol monoethyl ether acetate, ethylene glycol monomethyl acetate, or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate (EL)), ethyl 3-hydroxypropionate, propyl 2-oxypropionate, methyl 2-ethoxypropionate, propyl 2-methoxy propionate, and mixtures thereof.

In one embodiment, the process of the present invention, further comprises baking the coated substrate of step (a) (i.e., the substrate coated with the first minimum B.A.R.C. composition) at a temperature of 40° C. to 240° C., and in one embodiment, 90° C. to 150° C., and in one embodiment 100° C. to 130° C. for a period of time less than 3 minutes prior to step (b). While such a baking step that introduces cross links is not excluded from the scope of the present invention, it is preferable that such a baking step is substantially free of cross-linking steps, i.e., the baking process preferably does not substantially introduce crosslinking in the first minimum B.A.R.C. composition.

Figure 1:
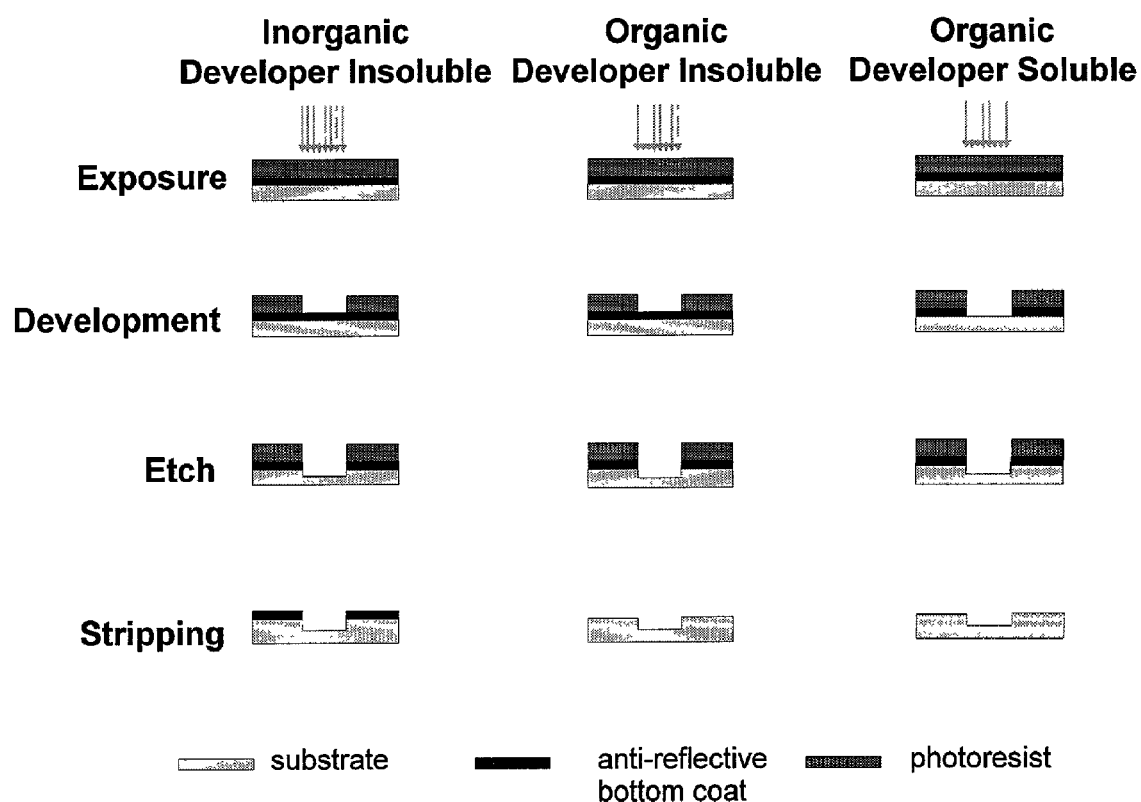
FIG. 1 illustrates different types of antireflective bottom coats.
Figure 2:
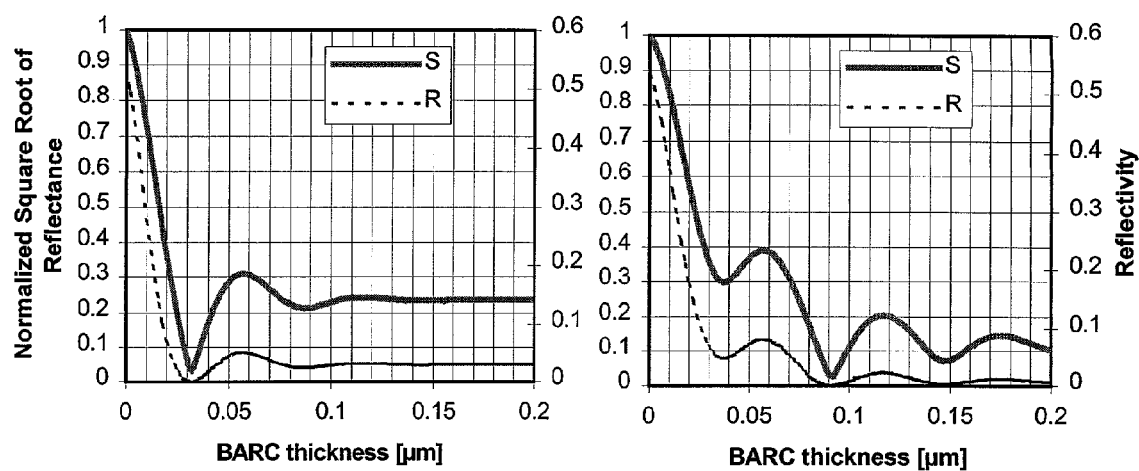
FIG. 2 is an example for near-optimal B.A.R.C.s for 1$^{st}$ and second minimum applications. n and k values for resist.

A B.A.R.C. acts as an interference device, a so-called Fabry-Perot etalon. As such, there will be a sequence of maxima and minima in the reflectance, the position and height of which depends on the optical constants of B.A.R.C., resist, and substrate as well as the exposure wavelength. An example for the interference behavior of a B.A.R.C. is given in FIG. 2 for two materials which have near-optimal optical constants for operation near the first and second interference minima. The intensity of the standing wave in the resist depends in a complex way on reflectivity, whereas the amplitude of the swing curve depends on the square root of the reflectivity. The plots in FIG. 2 show materials with different absorbances. In the plot on the left, the absorbance of the B.A.R.C. composition is very high, so that the thickness at or near the first minimum is the preferred operating thickness. In the plot on the right, a B.A.R.C. composition is used with lower absorbance, one that makes it appropriate for use at a thickness that corresponds to or near a second minimum. For developer insoluble B.A.R.C.s, the preferred operating region is frequently at or near the second minimum, which gives better tolerance to thickness variations of the B.A.R.C. composition and to topography in the substrate.

The first minimum B.A.R.C. composition of the present invention can be of any chemical composition provided it has the presently claimed properties. Typically A.R.C. compositions contain a dye moiety that may or may not be polymer bound. Some common examples of suitable dyes (including both polymer-bound and non polymer-bound dyes, i.e., dyes not bound to a polymer) are substituted and unsubstituted aromatic compounds such as substituted or unsubstituted styrenes, acetoxystyrenes, naphthalenes (e.g., naphthol AS, naphthol ASBI), chirorostyrene, nitrostyrene, benzyl methacrylate or acrylate, hydroxybenzophenones, anthracenes (e.g., 9-methylanthracene), bisphenyls (including hydroxybisphenols), methine dyes, anthraquinones, and hydroxysubstituted aromatic azo dyes. Substituted and unsubstituted heterocyclic aromatic rings containing heteroatoms such as oxygen, nitrogen, sulfur, or combinations thereof can also be used. Some examples of these heterocyclic dyes include acridines, pyrazoles, pyrrazolines, imadazoles, pyrrolidines, pyrans, piperidines, and quinolines. Some examples of dye-containing monomers that can be used to make the polymer-bound dyes include N-methylmaleimide, 9-anthrylmethyl methacrylate, benzyl methacrylate, hydroxystyrene, vinyl benzoate, vinyl 4-tert-butylbenzoate, ethylene glycol phenyl ether acrylate, phenoxypropyl acrylate, 2-(4-benzoyl-3-hydroxyphenoxy) ethyl acrylate, 2-hydroxy-3-phenoxypropyl acrylate, phenyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylaminophenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, and tetrahydroammonium sulfate salt of 3-(4-sulfophenyl)azoacetoacetoxy ethyl methacrylate. Dyes described in U.S. Pat. Nos. 6,114,085, 5,652,297, 5,981,145, and 6,187,506 can also be used. Specific examples of non-polymer bound dyes include coumarin 7, coumarin 138, coumarin 314, curcumin, and Sudan Orange G, and 9-anthracenemethanol. Polymer-bound dyes can be any light absorbing composition that absorbs light at the wavelength of interest. It is preferable that such polymer-bound dyes do not crosslink under the processing conditions, although polymer-bound dyes that can be crosslinked are also included within the scope of the present invention.

The final chemical structure of the polymer-bound dye can be optimized by having those types and ratios of monomeric units (i.e., light absorbing dye-containing monomers) that give the desired properties for the antireflective coating; for example, wavelength of absorption, intensity of absorption, solubility characteristics, refractive index, and coating properties. The wavelength of the polymer of the antireflective coating is matched to that of the irradiation wavelength. Typically, these wavelengths range from 145 nm to 450 nm, preferably, 436 nm and 365 nm for g- and i-line exposures respectively, 248 nm for KrF laser, 193 nm for ArF laser, and 157 nm for $F_2$ laser. Broadband exposure units require polymers that absorb over a broad range of wavelengths. A strongly absorbing polymer prevents light from reflecting back into the photoresist and acts as an effective antireflective coating. The choice of comonomers and substituents allows for the refractive index and the absorption wavelength and intensity of the polymer to be optimized to give the minimum back reflection into the photoresist. Furthermore, a strongly absorbing polymer allows for thinner coatings to be used beneath the photoresist, thus resulting in a better image transfer.

Solubility of the polymer bound dyes in solvents of lower toxicity is another very important characteristic of the present invention. Examples of such lower toxicity solvents include propylene glycol methyl ether acetate (PGMEA), propylene glycol methyl ether (PGME), ethyl lactate (EL), methyl pyruvate (MP), methyl amyl ketone (MAK), diacetone alcohol, or ethoxyethyl propionate (EEP). However, designing polymers for such solubility must take into account the need to prevent intermixing of the bottom antireflective layer and the photoresist. For example, if the polymer bound dye is soluble in EL but not in PGMEA, then EL is an appropriate solvent for use with a PGMEA based top resist. The use of water or mixtures of water and organic solvents, in particular alcohols, is also possible in principle provided that the dissolution rate of the B.A.R.C. in the aqueous base developer is sufficiently slow in the unexposed state and sufficiently high in the exposed, baked and chemically transformed state to generate an essentially non-isotropic development process. Changing the substituents on the polymer can further optimize the solubility characteristics of the polymer.

In one embodiment, the first minimum B.A.R.C. composition of the present invention comprises a polymer derived from monomers comprising mevalonic lactone methacrylate (MLMA), and in one embodiment monomers comprising 2-methyladamantyl methacrylate (MAdMA). In one embodiment, the polymer is a terpolymer of N-methylmaleimide, MLMA, and MAdMA.

The process used for polymerization to prepare the polymers for the first minimum B.A.R.C. composition of the present invention can be any of the ones known in the art for polymerizing vinyl/acrylic monomers, such as, ionic, free radical, or coordination polymerization. The polymer structure formed can be composed of alternate, block or random copolymers. The weight average molecular weight of the polymer ranges from about 500 to about 50,000 and in one embodiment from 1,000 to 40,000 and in one embodiment from 2,000 to 20,000.

The mole % of the dye containing monomer can range from about 5 to to 95%, and the mole % of the comonomer or comonomers can range from about 5 to about 95% in the final polymer. Additionally, the polymer may contain unreacted precursors and/or monomers from the synthetic steps of the preparation of the polymer. The dye functionality can be incorporated in the monomer prior to polymerization or reacted with the polymer after polymerization.

The first minimum B.A.R.C. compositions of the present invention can comprise additional optional components that may be added to enhance the performance of the B.A.R.C. composition or the final image. Such components include surface levelling agents, adhesion promoters, antifoaming agents, etc. The absorption of the antireflective coating can be optimized for a certain wavelength or ranges of wavelengths by the suitable choice of substituents on the dye functionality. Using substituents that are electron withdrawing or electron donating generally shifts the absorption wavelength to longer or shorter wavelengths respectively. In addition, the solubility of the antireflective polymer in a particularly preferred solvent can be adjusted by the appropriate choice of substituents on the monomers.

The first minimum B.A.R.C. compositions of the present invention have a solids content of up to 8% solids, and in one embodiment up to 6%, and in one embodiment up to 2% solids. The exact weight used is dependent on the molecular weight of the polymer(s) and other components used to make the B.A.R.C. composition, and the film thickness of the coating desired. Typical solvents, used as mixtures or alone, that can be used are PGME, PGMEA, EL, cyclopentanone, cyclohexanone, hexanone, and gamma butyrolactone.

Since the antireflective film is coated on top of the substrate and may be further subjected to dry etching, it is envisioned that the film is of sufficiently low metal ion level and purity that the properties of the semiconductor device are not adversely affected. Treatments such as passing a solution of the B.A.R.C. composition through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. As disclosed above, the coating may be further heated on a hot plate or convection oven to remove any residual solvent, to introduce crosslinking (if desired) or for further processing if desired.

Photoresist compositions to be coated on top of the B.A.R.C. layer can be any of the types used in the semiconductor industry provided the sensitivity of the photoactive compound in the photoresist matches that of the antireflective coating.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature, which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting hydroxyphenolic compounds with naphthoquinone diazide acids or their derivatives. The sensitivity of these types of resists typically ranges from about 350 nm to 440 nm.

Photoresists sensitive to short wavelengths, between about 145 nm and about 350 nm can also be used. These resists, sensitive around 248 nm, normally comprise polyhydroxystyrene or substituted polyhydroxystyrene derivatives, a photoactive compound (including a photoacid generator in the case of a chemically amplified system), and optionally a solubility inhibitor. The following references exemplify the types of photoresists used: U.S. Pat. Nos. 4,491,628, 5,069,997 and 5,350,660.

Similarly, resists sensitive around 193 nm can also be used. Examples of 193 nm resists include polyacrylates or polymethacrylates, copolymers based on cycloolefins (such as norbornene, tetracyclooctadecene and derivatives of these monomers) and maleic anhydrides, and hybrid copolymers or mixtures of copolymers based on cycloolefins, maleic anhydrides and acrylates/methacrylates.

After coating the substrate with the B.A.R.C. composition of the present invention, and baking the coated substrate, an edge bead remover may be applied to clean the edges of the coated substrate using processes well known in the art. The preferred range of temperature is from about 70° C. to about 140° C. A film of photoresist is then coated on top of the antireflective coating and baked to substantially remove the photoresist solvent, or for other processing. Thus, in one embodiment, the present invention further comprises baking the coated substrate of step (c) prior to step (d). In one embodiment, this baking temperature ranges from 80° C. to 150° C. The substrate with the coated B.A.R.C. layer and photoresist layer is imagewise exposed and developed in an aqueous developer to remove the exposed (for positive photoresist) or alternatively unexposed (for negative photoresist). Preferably the developer is an aqueous basic developer, such as an aqueous metal ion free hydroxide. Suitable examples of such metal ion free hydroxide include tetraalkylammonium hydroxides (such as tetramethylammonium hydroxide). An optional heating step can be incorporated into the process prior to development and after exposure. The process of coating and imaging photoresists is well known to those skilled in the art and is optimized for the specific type of resist used. If necessary, the patterned substrate can then be dry etched in a suitable etch chamber to remove any remaining traces of the antireflective film, with the remaining photoresist acting as an etch mask.

In one embodiment of the present invention, the image produced by the claimed process is substantially free of undercutting and footing. While not wishing to be bound by theory, it is believed that this is due to the presence of an anisotropic component (introduced by actinic radiation) in the B.A.R.C. dissolution. This can be illustrated by the following. In the case of a non-photosensitive developer-soluble bottom antireflective coatings (not of the present invention), if a photosensitive layer is used on top of such a B.A.R.C. composition, the structure defined in it will act as a wet etch mask for the bottom layer. It is instructive to compare the present invention to such non-photosensitive developer-soluble B.A.R.C. compositions and to the classical process of wet etching (no B.A.R.C. present). In classical wet etching, for example etching of silicon dioxide with diluted hydrogen fluoride solutions, the photoresist structure is defined first using aqueous base developer. The bottom layer is subsequently etched isotropically, i.e., the etch rate is the same in all directions. If the etchant has dissolved a thickness "d" of the silicon dioxide in the vertical direction, it will also have dissolved a thickness "d" in the horizontal direction. In a first approximation, the geometrical locus of the etch front is given by the superposition of spheres at the initial etchant/silicon dioxide interface, where the radius of the spheres is given by r=v t, where v is the etch rate (with dimensions on length/time) and t is the etch time (see FIG. 5). It is clear that such a process will always result in an undercut and is not suitable for, e.g., very fine lines, which will topple if the undercut exceeds a critical value.

In the case of a photoresist on a non-photosensitive but developer-soluble B.A.R.C., the situation is different in that the photoresist development and the B.A.R.C etching occur in one step, since the aqueous base developer performs both functions. The development of a high-contrast photoresist proceeds quickly in the center where the aerial image intensity is highest. The development front will reach the bottom of the resist and then proceed to develop the resist mostly sideways. In the case of a developer-soluble B.A.R.C, isotropic etching of the B.A.R.C will begin as soon as the developer front reaches the resist/B.A.R.C. interface. A new spherical etch front will spread out through the B.A.R.C. from the initial point of contact, and additional spherical etch fronts will be generated in the exposed area as the resist gradually clears away from the B.A.R.C. surface. All of the B.A.R.C. etching is still isotropic, but now the areas at the edge of the resist feature clear at a much later time, so that the B.A.R.C. near them is exposed to the developer for a shorter time. Since these areas contributed the most to the undercut in the above example of the wet etching of a silicon dioxide layer, it is possible to improve on the amount of underetch of a developer-soluble B.A.R.C. relative to the situation in the silicon dioxide example. However, in practice, it is still difficult to achieve images that are free of either footing or undercutting, since due to the isotropic nature of the B.A.R.C. etch the transition from footing to undercutting occurs in a very short time. This makes the developer-soluble B.A.R.C. process inherently unstable.

The photosensitive B.A.R.C. of the present invention provides a stable process with which undercut or footing can be prevented by providing a strong anisotropic component in the B.A.R.C. etch. The B.A.R.C. is subjected to the same aerial image as the photoresist, and it will be highly soluble in the center of the exposed area, while remaining insoluble in the dark area. In other words, there will be a negative lateral gradient in solubility from the center of the open feature to its edge. As it does in a photoresist, the development will slow down and essentially stop as the development front progresses from the center to the edge of the exposed area. With proper adjustment of the process conditions, this makes it possible to achieve a stable process that results in an image that is free of both footing and undercutting. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthesis and Performance Examples

Example 1

To a 250 mL 4 neck flask equipped with a condenser, a thermometer, a nitrogen inlet, and a mechanical stirrer were added benzyl methacrylate (6.5 g; 0.037 moles), methacrylate ester of mevalonic lactone (MLMA) (13.5 g; 0.068 mole), azobisisobutyinitrile (AIBN) (3 g) and tetrahydrofuran (THF) (50 g). A solution was obtained and was degassed for 10 minutes. The reaction was refluxed for 6 hours then drowned into 600 mL of hexane. The precipitated polymer was filtered and dried. The polymer was next dissolved in 60 g of cyclopentanone and then slowly added to 600 mL of methanol to reprecipitate. The polymer was filtered, rinsed and dried. The reprecipitated polymer was redissolved in 60 g of cyclopentanone and then precipitated again into 600 mL of methanol. The polymer was filtered, rinsed and dried. The polymer coating had refractive indices n and k of 1.85 and 0.34 respectively at 193 nm as measured by a J. A. Woollam WVASE 32™ Ellipsometer.

Example 2

Comparative Example

To the polymer (3.45 wt %) from Example 1 prepared above were added triphenylsulfonium nonaflate (0.00871 wt %), tridecylamine (0.0034 wt %), trismethoxyethoxyethylamine (0.123 wt %), Fluorad™ FC-4430 (0.10 wt %) (a fluorosurfactant available from 3M) and ethyl lactate (96.5 wt %). The solution was mixed and filtered through a 0.1 micrometer (μm) filter.

A silicon wafer was coated first with 780 Å (78 nm) of the above B.A.R.C. solution with a softbake (SB) 110° C./60 seconds. Next B.A.R.C. coated wafer was coated with 3300 Å of AZ® EXP AX2020P resist (a commercial photoresist comprising a copolymer derived from a hybrid acrylate, cycloolefin, and maleic anhydride; available from AZ Electronic Materials Business Unit of Clariant Corporation), using a 130° C./60 second SB. The coated wafer was exposed using an ISI 193 nm ministepper. The exposed wafer had a post exposure bake (PEB) of 60 seconds at 120° C. with a puddle development of 60 seconds of AZ® 300 MIF Developer (an aqueous solution of tetramethylammonium hydroxide available from AZ Electronic Materials Business Unit of Clariant Corporation). The results showed that for 0.18 μm lines, the resist was over exposed but the B.A.R.C. was not completely removed.

Example 3

Comparative Example

To the polymer (3.46 wt %) from Example 1 prepared above were added triphenylsulfonium nonaflate (0.0340 wt %), trimethylsulfonium hydroxide (0.0035 wt %), Fluorad™ FC-4430 (0.10 wt %), and ethyl lactate (96.5 wt %). The solution was mixed and filtered through a 0.1 μm filter.

A silicon wafer was coated first with 600 Å (60 nm) of the above B.A.R.C. solution with a SB 110° C./60 seconds. Next B.A.R.C. coated wafer was coated with 3300 Å (330 nm) of AZ® EXP AX1050P (a commercial photoresist comprising a polymethacrylate; available from AZ Electronic Materials Business Unit of Clariant Corporation, as a solution in PGMEA) resist using a bake of 130° C./60 second. The coated wafer was exposed using a ISI 193 nm ministepper. The exposed wafer had a PEB of 60 seconds at 120° C. with a puddle development of 60 seconds of AZ® 300 MIF Developer. The results show that for 0.18 μm lines, 23 millijoules/cm$^2$ (mJ/cm$^2$) was required to clear these isolated lines. The B.A.R.C. layer at dense lines was not opened up even up to 25 mJ/cm$^2$ and the resist was grossly over exposed.

Example 4

A B.A.R.C. solution was prepared as follows. To the polymer (1.77 wt %) prepared above in Example 1 were added triphenylsulfonium nonaflate (0.0270 wt %), tridecylamine (0.0023 wt %), Fluorad™ FC-4430 (0.10 wt %), and ethyl lactate (98.2 wt %). The resulting solution was filtered through a 0.1 μm filter.

A silicon wafer was coated with the 300 Å (30 nm) of the above B.A.R.C. solution using a SB 110° C./60 seconds. Next B.A.R.C. coated wafer was coated with 3300 Å (330 nm) of AZ® EXP AX2020P resist using a SB of 130° C./60 seconds. The coated wafer was exposed using an ISI 193 nm ministepper. The exposed wafer had a PEB of 60 seconds at 120° C. with a puddle development of 60 second of AZ® 300 MIF Developer.

In contrast the results showed that 11 mJ/cm$^2$ was required to cleanly open 0.18 μm isolated lines. The lines in contrast were well formed and not over exposed. The dense lines (1:1) cleared at 17 mJ/cm$^2$ with clean well-shaped dense 1:1 lines.

Example 5

A B.A.R.C. solution was prepared as follows. To the polymer (1.77 wt %) prepared above in Example 1 was added of triphenylsulfonium nonaflate (0.0270 wt %), adamantamine (0.0028 wt %), Fluorad FC-4430 (0.10 wt %), and ethyl lactate (98.2 wt %). The resulting solution was filtered through a 0.1 μm filter.

A silicon wafer was coated with the 300 Å (30 nm) of the above B.A.R.C. solution using a SB 110° C./60 seconds. Next B.A.R.C. coated wafer was coated with 3300 Å (330 nm) of AZ® EXP AX2020P resist using a SB of 130° C./60 seconds. The coated wafer was exposed using an ISI 193 nm ministepper. The exposed wafer had a PEB of 60 seconds at 120° C. with a puddle development of 60 second of AZ® 300 MIF Developer.

In contrast the results show that 13 mJ/cm$^2$ was required to cleanly open 0.18 μm isolated lines. The dense lines (1:1) cleared at 21 mJ/cm$^2$.

Example 6

A B.A.R.C. solution was prepared as follows. To the polymer (1.77 wt %) prepared above in example 1 was added of triphenylsulfonium nonaflate (0.0270 wt %), trimethylsulfonium hydroxide (0.0023 wt %), Fluorad™ FC-4430 (0.10 wt %), and ethyl lactate (98.2 wt %). The resulting solution was filtered through a 0.1 μm filter.

A silicon wafer was coated with the 300 Å (30 nm) of the above B.A.R.C. solution using a SB 110° C./60 seconds. Next B.A.R.C. coated wafer was coated with 3300 Å (330 nm) of AZ® EXP AX2020P resist using a SB of 130° C./60 seconds. The coated wafer was exposed using an ISI 193 nm ministepper. The exposed wafer had a PEB of 60 seconds at 120° C. with a puddle development of 60 second of AZ® 300 MIF Developer.

In contrast the results show that 15 mJ/cm² was required to cleanly open 0.18 μm isolated lines. The dense lines open even up to 15 mJ/cm².

Comparison of Examples 4, 5, and 6 (utilizing first minimum B.A.R.C.s) with Examples 2 and 3 (utilizing second minimum B.A.R.C.) reveals an advantage in going from second minimum to first minimum. At second minimum, the B.A.R.C. and resist would not image well. At first minimum the combination imaged well and functioned well as a B.A.R.C., reducing standing waves.

Example 7

Comparative Example

A silicon wafer was coated first with 3300 Å of AZ® EXP AX2020P resist using a SB of 110° C./60 seconds (No B.A.R.C. was used). An ISI 193 nm ministepper was used for exposure. The exposed wafer had a PEB of 90 seconds at 130° C. with a development using 30-second puddle of AZ® 300 MIF. The optimum dosage for dose to print was used. The example clearly showed more standing waves.

Example 8

To a 250 ml, 4 neck flask equipped with a condenser, a thermometer, a nitrogen gas inlet and mechanical stirrer were added the methacrylate ester of 9-anthracene methanol (AMMA) (6.4 g, 0.0227 mole), MLMA (8.6 g, 0.0434 mole), AIBN (3 g) and cyclopentanone (40 g). A solution was obtained and was degassed for 10 minutes. The reaction was refluxed for 4.5 hours then drowned into 600 ml of hexane. The precipitated polymer was filtered and dried.

To the polymer (0.26 g) above were added triphenylsulfonium nonaflate (0.016 g), Fluorad™ FC-4430 (0.01 g) and 9.73 g of ethyl lactate. The (2.6% solids) solution was mixed and filtered through a 0.1 μm filter.

A silicon wafer was coated first with 600 Å (60 nm) of the prepared B.A.R.C. solution and softbaked at 110° C./60 seconds. Next the B.A.R.C. coated wafer was coated with 6310 Å (631 nm) of AZ® DX5200P photoresist (a hybrid acetal resist available from AZ Electronic Materials Business Unit of Clariant Corporation) using a bake of 90° C./60 second. The coated wafer was imagewise exposed using an ISI 193 nm ministepper. The exposed wafer was given a PEB of 60 seconds at 120° C., followed by a puddle development of 60 seconds with AZ® 300 MIF Developer. The SEM results showed that the B.A.R.C. cleared down to the substrate with a dose of 20 mJ/cm2. The B.A.R.C. coating also gave a refractive index and absorption at 248 nm for n and k of 1.45 and 0.38 respectively as measured by a J. A. Woollam WVASE 32™ Ellipsometer.

Simulation Examples

For the present invention, many promising formulations were developed that showed photosensitivities very similar to the photoresists used for testing and that seemed to be essentially free of intermixing phenomena. At first all of these formulations were tested at thicknesses corresponding to the second reflectivity minimum of the B.A.R.C. into the photoresist. The reason for this was that it was deemed to be easier from the synthetic side to include fewer highly absorbing units in the B.A.R.C., and as can be seen from FIG. 2, lower absorbance gives better performance for the second or higher minima. The experimental results consistently showed that photosensitive second minimum B.A.R.C.s opened large features reasonably well but scummed strongly for fine features. The scumming went away at high exposure doses, but for these doses already a considerable undercut was observed. Surprisingly, it was found that this behavior did not occur when the same B.A.R.C.s were applied in a thickness appropriate for work at the first minimum. The resist then cleaned out well and without scumming even for sub-quarter micron features. In many cases, undercut and footing-free, vertical sidewall were obtained for which no clear discontinuity in slope could be discerned between the photoresist and the B.A.R.C.

This surprising and unexpected behavior led to carrying out a simulation of the light distribution and the latent image in the bottom A.R.C. This is not usually done for bottom A.R.C.s because it is of no interest for the non-photosensitive varieties, and it requires modifications or special tricks to do this with standard commercial programs. For example, with the popular PROLITH/2 simulation program, the photoresist needs to be defined as a contrast enhancement layer and the B.A.R.C. as a photoresist in order to be able to perform the simulation.

The results of the simulations with PROLITH/2 simulation program showed that there is a standing wave node in the B.A.R.C. at approximately $\lambda/(2n)$ thickness. This standing wave is still visible even after diffusion in a post exposure bake is taken into account (shown in FIG. 3 for a chemically amplified B.A.R.C.). The scumming of the photosensitive B.A.R.C. was the result of this standing wave node and the low amount of light coupled into the lower part of the B.A.R.C.

In contrast, if a first minimum B.A.R.C. is imaged, its thickness is given by a complex formula but it will always be below the $\lambda/(2n)$ thickness of the standing wave node (possibly excepting transparent substrates). The latent image does not exhibit the standing wave node, and the soluble area goes cleanly down the middle of the image, especially after the post exposure bake. As can be seen from the corresponding simulations (FIG. 4), a first minimum B.A.R.C. is predicted to open up cleanly down to the substrate, as is indeed observed experimentally. It is clear from the above that the use of a first minimum photosensitive B.A.R.C.s has intrinsic imaging advantages over B.A.R.C.s designed to operate at higher film thicknesses.

Each of the documents referred to above is incorporated herein by reference in its entirety, for all purposes. Except in the Examples, or where otherwise explicitly indicated, all numerical quantities in this description specifying amounts and concentrations of materials, reaction and process conditions (such as temperature, time), and the like are to be understood to be modified by the word "about".

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for forming an image on a substrate, comprising the steps of:
    (a) coating on the substrate a first layer of a radiation sensitive antireflective composition;
    (b) coating a second layer of a photoresist composition onto the first layer of the antireflective composition;
    (c) selectively exposing the coated substrate from step (b) to actinic radiation; and (d) developing the exposed coated substrate from step (c) in a single step with an aqueous alkali developing solution to form an image;

wherein both the photoresist composition and the antireflective composition are exposed in step (c); both are developed in step (d) using a single developer; wherein the antireflective composition of step (a) is a first minimum bottom antireflective coating (B.A.R.C.) composition, having a solids content of up to about 8 weight % solids, and a maximum coating thickness of the coated substrate of $$\frac{\lambda}{2n}$$

wherein λ is the wavelength of the actinic radiation of step (c) and n is the refractive index of the B.A.R.C. composition and a minimum coating thickness greater than zero.

2. The process of claim 1, wherein the radiation sensitive antireflective composition and the photoresist composition comprise a positive-working composition wherein the antireflective and the photoresist compositions are initially insoluble in the developer but are rendered developer-soluble upon exposure to actinic radiation.

3. The process of claim 1, wherein the radiation sensitive antireflective composition and the photoresist composition comprise a negative-working composition wherein the antireflective and the photoresist compositions are initially soluble in the developer but are rendered developer-insoluble upon exposure to actinic radiation.

4. The process of claim 1, wherein the B.A.R.C. composition is free of cross-linking and insoluble in the photoresist solvent.

5. The process of claim 1, further comprising baking the coated substrate of step (a) at a temperature of 40° C. to 240° C. for a period of time less than 3 minutes prior to step (b).

6. The process of claim 5, wherein the baking process is free of cross-linking steps.

7. The process of claim 1, wherein the first minimum B.A.R.C. composition has a maximum coating thickness of about 50 nm for 157 nm and 193 nm exposures, 70 nm for 248 nm exposure and 120 nm for 365 nm exposure.

8. The process of claim 1, wherein the image is free of undercutting and footing.

9. The process of claim 1, wherein the first minimum B.A.R.C. composition comprises a dye.

10. The process of claim 9, wherein the dye is polymer-bound.

11. The process of claim 9, wherein the dye is non polymer-bound.

12. The process of claim 1, wherein the first minimum B.A.R.C. composition comprises a polymer derived from at least one monomer selected from the group consisting of N-methylmaleimide, mevaloniclactone methacrylate (MLMA), 2-methyladamantyl methacrylate (MAdMA), benzyl methacrylate, 9-anthrylmethyl methacrylate (AMMA), styrene, hydroxystyrene, acetoxystyrene, vinyl benzoate, vinyl 4-tert-butylbenzoate, ethylene glycol phenyl ether acrylate, phenoxypropyl acrylate, 2-(4-benzoyl-3-hydroxyphenoxy)ethyl acrylate, 2-hydroxy-3-phenoxypropyl acrylate, phenyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylaminophenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, and tetrahydroammonium sulfate salt of 3-(4-sulfophenyl)azoacetoacetoxy ethyl methacrylate.

13. The process of claim 1, wherein the first minimum B.A.R.C. composition comprises a terpolymer of N-methylmaleimide, MLMA, and MAdMA.

14. The process of claim 1, further comprising baking the coated substrate of step (c) prior to step (d).

15. The process of claim 1, wherein the developer is an aqueous metal ion free hydroxide.

16. The process of claim 15, wherein the aqueous metal ion free hydroxide is a tetraalkylammonium hydroxide.

17. The process of claim 16, wherein the tetraalkylammonium hydroxide is tetramethylammonium hydroxide.

18. The process of claim 1, wherein the substrate is a semiconductor substrate.

19. The process of claim 1, wherein the wavelength of actinic radiation in step (c) ranges from about 145 nm to 450 nm.

20. The process of claim 19, wherein the wavelength is 193 nm.

21. The process of claim 19, wherein the wavelength is 248 nm.

22. The process of claim 19, wherein the wavelength is 157 nm.

23. The process of claim 1, wherein the photoresist composition comprises an acrylate or methacrylate polymer.

24. The process of claim 1, wherein the photoresist composition comprises a cycloolefin/maleic anhydride copolymer.

25. The process of claim 1, wherein the photoresist comprises a polyhydroxystyrene or a protected polyhydroxystyrene polymer.

* * * * *